(12) United States Patent
Kim

(10) Patent No.: US 8,314,641 B2
(45) Date of Patent: *Nov. 20, 2012

(54) SELF-TIMED FINE TUNING CONTROL

(75) Inventor: Kang Y. Kim, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 259 days.

This patent is subject to a terminal disclaimer.

(21) Appl. No.: 12/797,830

(22) Filed: Jun. 10, 2010

(65) Prior Publication Data

US 2010/0244916 A1    Sep. 30, 2010

Related U.S. Application Data

(63) Continuation of application No. 11/824,617, filed on Jul. 2, 2007, now Pat. No. 7,750,698, which is a continuation of application No. 11/485,059, filed on Jul. 12, 2006, now Pat. No. 7,489,169, which is a continuation of application No. 10/929,066, filed on Aug. 27, 2004, now Pat. No. 7,218,158.

(51) Int. Cl.
*H03L 7/06* (2006.01)

(52) U.S. Cl. ............ 327/158
(58) Field of Classification Search ............ 327/156, 327/158, 161
See application file for complete search history.

(56) References Cited

U.S. PATENT DOCUMENTS

| | | | |
|---|---|---|---|
| 5,625,303 A * | 4/1997 | Jamshidi | 326/106 |
| 5,930,182 A | 7/1999 | Lee | |
| 5,930,198 A | 7/1999 | Ryan | |
| 6,323,705 B1 | 11/2001 | Shieh et al. | |
| 6,351,167 B1 * | 2/2002 | Hein et al. | 327/158 |
| 6,549,041 B2 | 4/2003 | Waldrop | |
| 6,727,739 B2 | 4/2004 | Stubbs et al. | |
| 6,731,147 B2 | 5/2004 | Fiscus | |
| 2002/0015338 A1 | 2/2002 | Lee | |
| 2003/0094984 A1 * | 5/2003 | Weis et al. | 327/182 |

* cited by examiner

*Primary Examiner* — Quan Tra
(74) *Attorney, Agent, or Firm* — Lerner, David, Littenberg, Krumholz & Mentlik, LLP

(57) ABSTRACT

A delay lock loop having improved timing control of input signals. Specifically, a fine delay block is provided having feedback loops therein such that the fine delay block is self tuning. The output of the fine delay block may be implemented to control a coarse delay block in a delay lock loop.

3 Claims, 13 Drawing Sheets

SELF-TIMED FINE TUNING CONTROL

CROSS-REFERENCE TO RELATED APPLICATIONS

This application is a continuation of U.S. patent application Ser. No. 11/824,614, which was filed on Jul. 2, 2007, and is now U.S. Pat. No. 7,750,698, which was issued on Jul. 6, 2010, which is a continuation of U.S. patent application Ser. No. 11/485,059, which was filed on Jul. 12, 2006, and is now U.S. Pat. No. 7,489,169, which was issued on Feb. 10, 2009, which is a continuation of U.S. patent application Ser. No. 10/929,066, which was filed on Aug. 27, 2004, and is now U.S. Pat. No. 7,218,158, which was issued on May 15, 2007, the disclosures of which are incorporated herein by reference.

BACKGROUND OF THE INVENTION

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Synchronous dynamic random access memory (SDRAM) devices generally operate under a single external clock signal that is routed to a number of locations throughout the memory device. Synchronization of clock and data signals may be desirable to ensure proper operation of the memory device. By routing a single clock signal along a number of signal paths and to various associated circuitry, delays are introduced along each of the signal paths. As can be appreciated, each of the signal paths and associated circuitry may produce a different delay, and each delay can effect the synchronization and operation of the memory device.

One important timing requirement involves output data signals. The timing of when output data is made available or is clocked through the output buffer of the memory device is dependent on when valid data is available from the memory cell array. Specifically, in conventional systems, data output timing is determined by the access time ($t_{AC}$) and the output hold time ($t_{OH}$) of the SDRAM. To ensure valid data, the output data is synchronized to be clocked from the output buffer during the time interval between $t_{AC}$ and $t_{OH}$. In certain SDRAM devices, data output is synchronized to the rising and/or falling edge of the system clock using a delay lock loop (DLL) for controlling the internal clock of the memory device so as to synchronize data output with the rising/falling edges of the external system clock. The DLL circuitry generally inserts delay time between the clock input buffer and the data output buffer thereby making the data switch simultaneously with the external clock.

During high speed operation of the memory device, accurate and timely adjusting of the delay units in the DLL may be difficult due to the stringent timing margin associated with the device. As can be appreciated, to provide optimal operation of the memory device, a receiving device should receive data no later than specified time ($t_{AC}$) after the previous rising edge of the clock signal. Waiting a time ($t_{AC}$) allows the input of a receiving device to stabilize before the next rising edge of the clock when the data is latched by the receiving device. Similarly, a transmitting device must continue to provide the data to the receiving device for a specified time ($t_{OH}$) after the rising edge of the clock signal to ensure that the receiving device has completely latched the communicated data before the transmitting device removes the data from the bus. Timing and synchronization of the clock signals during high speed operation can be especially challenging for designers of memory devices.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
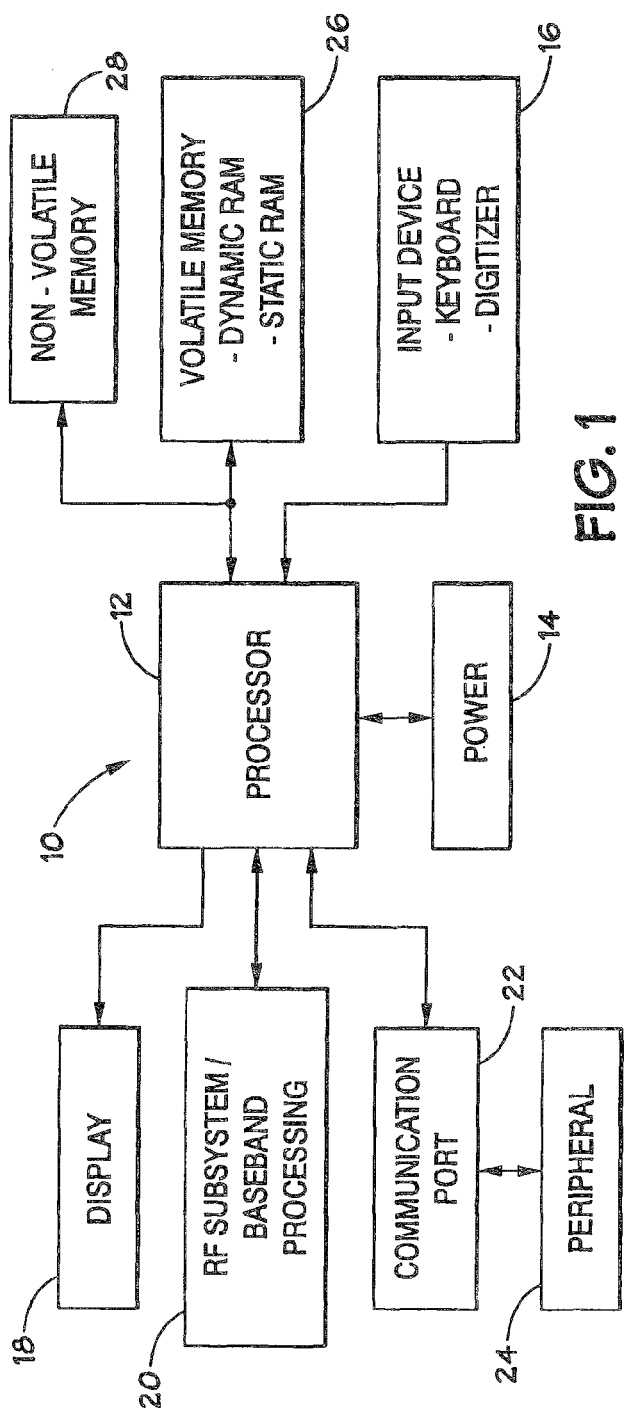
FIG. 1 illustrates a block diagram of an exemplary processor-based device in accordance with the present technique.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include an input device, such as buttons, switches, a keyboard, a light pen, a mouse, and/or a voice recognition system, for instance. A display 18 may also be coupled to the processor 12. The display may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 generally controls the device 10 through the use of software programming, memory is coupled to the processor 12 to store and facilitate execution of the software program. For instance, the processor 12 may be coupled to volatile memory 26, which may include dynamic random access memory (DRAM), synchronous dynamic random access memory (SDRAM) static random access memory (SRAM), Double Data Rate (DDR) memory, etc. The processor 12 may also be coupled to non-volatile memory 28. The non-volatile memory 28 may include a read only memory (ROM), such as an erasable programmable read only memory (EPROM) or Flash Memory, to be used in conjunction with the volatile memory. The size of the non-volatile memory is typically selected to be just large enough to store any necessary operating system, application programs, and fixed data. The volatile memory 26, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

The volatile memory 26 may include a number of SDRAMs which implement DDR technology. As can be appreciated, the SDRAM differs from a DRAM in that the SDRAM is controlled synchronously with a timing source, such as a system clock. To accomplish synchronous control, latches are used to provide data and other information on the inputs and outputs of the SDRAM. Thus, in a read operation for example, the processor 12 may access a data output latch at a predetermined number of clock cycles after issuing the read request (i.e. tAC). The access time (tAC) typically corresponds to the amount of time needed to access the requested data, move the data to the output latch, and allow the data to stabilize. The data is clocked out of the output latch synchronous with the system clock which provides the timing source for the processor 12. Synchronization of the data read from the output latch with the system clock is generally implemented via a delay lock loop (DLL) circuit, as previously discussed and as further discussed in more detail below. In general, the DLL locks the data output signal to the system clock by shifting the output data in time such that it is nominally aligned with the system clock. Thus, the DLL can compensate for timing delays introduced by various components in the SDRAM.

Write operations are also performed synchronous with a timing source, such as the system clock or other externally provided timing source. Thus, data may be clocked into an input latch and written to the memory array under control of a write clock provided from the external device which is performing the write operation. As can be appreciated, delay lock loops may also be implemented to synchronize write data with the write clock.

Figure 2:
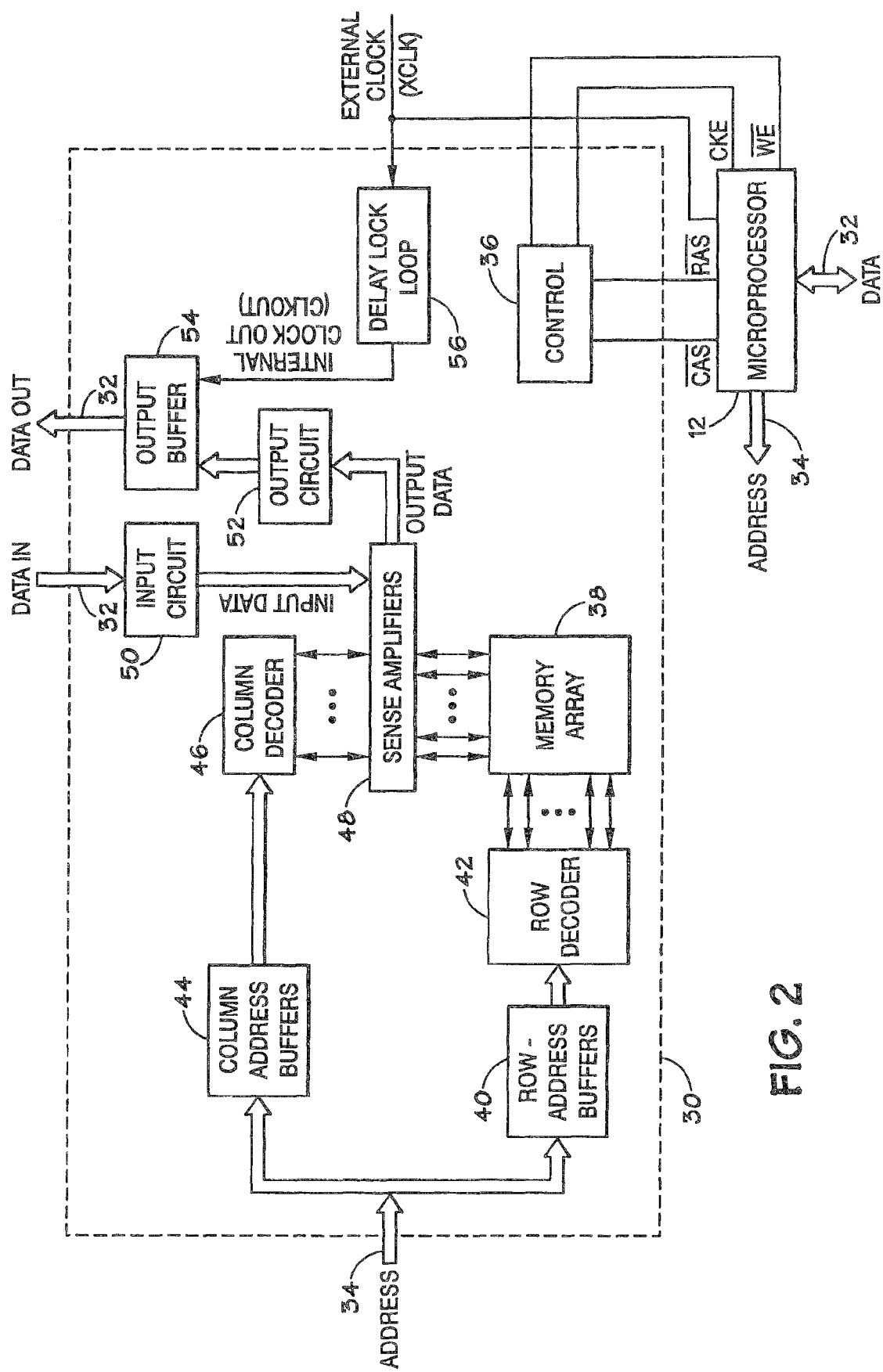
FIG. 2 illustrates a block diagram of an exemplary memory device used in the processor-based device of FIG. 1.

Turning now to FIG. 2, a block diagram depicting an exemplary embodiment of a DDR SDRAM is illustrated. The description of the DDR SDRAM 30 has been simplified for illustrative purposes and is not intended to be a complete description of all features of a DDR SDRAM. The present techniques may not be limited to DDR SDRAMs, and may be equally applicable to other synchronous random access memory devices, programmable timing devices, including duty cycle correction (DCC) devices and other devices for use in communication applications, such as double-edge triggered applications, which may benefit from strict adherence to timing. Those skilled in the art will recognize that various devices may advantageously benefit from implementation of embodiments of the present invention.

Control, address, and data information provided over a memory bus are represented by individual inputs to the SDRAM 30. These individual representations are illustrated by a databus 32, address lines 34, and various discrete lines directed to control logic 36. As is known in the art, the SDRAM 30 includes a memory array 38 which comprises rows and columns of addressable memory cells. Each memory cell in a row is coupled to a word line. Additionally, each memory cell in a column is coupled to a bit line. Each cell in the memory array 38 typically includes a storage capacitor and an access transistor.

The SDRAM 30 interfaces with the a microprocessor 12 through address lines 34 and data lines 32. Alternatively, the SDRAM 30 may interface with other devices, such as a SDRAM controller, a microcontroller, a chip set, or other electronic systems. The microprocessor 12 may also provide a number of control signals to the SDRAM 30. Such signals may include row and column address strobe signals (RAS and CAS), a write enable signal (WE), a clock enable signal (CKE), and other conventional control signals. The control logic 36 controls the many available functions of the SDRAM 30. In addition, various other control circuits and signals not detailed herein may contribute to the operation of the SDRAM 30 as known to those skilled in the art.

A row address buffer 40 and a row decoder 42 receive and decode row addresses from row address signals provided on the address lines 34. Each unique row address corresponds to a row of cells in the memory array 38. The row decoder 42 typically includes a word line driver, an address decoder tree, and circuitry which translates a given row address received from row address buffers 40 and selectively activates the appropriate word line of the memory array 38 via the word line drivers.

A column address buffer 44 and a column decoder 46 receive and decode column address signals provided on the address lines 34. The column decoder 46 also determines when a column is defective and the address of a replacement column. The column decoder 46 is coupled to sense amplifiers 48. The sense amplifiers 48 are coupled to complimentary pairs of bit lines of the memory array 38.

The sense amplifiers 48 are coupled to data-input (i.e., write) circuitry 50 and data-output (i.e., read) circuitry 52.

The data-input circuitry 50 and the data-output circuitry 52 include data drivers. During a write operation, the data bus 32 provides data to the data-in circuitry 50. The sense amplifier 48 receives data from the data-in circuitry 50 and stores the data in the memory array 38 as a charge on a capacitor of a cell at an address specified on the address line 34. In one embodiment, the data bus 32 is an 8-bit data bus carrying data at 400 MHz or higher.

During a read operation, the DDR SDRAM 30 transfers data to the microprocessor 12 from the memory array 38. Complimentary bit lines for the accessed cell are equilibrated during a precharge operation to a reference voltage provided by an equilibration circuit and a reference voltage supply. The charge stored in the accessed cell is then shared with the associated bit lines. The sense amplifier 48 detects and amplifies a difference in voltage between the complementary bit lines. Address information received on address lines 34 selects a subset of the bit lines and couples them to complementary pairs of input/output (I/O) wires or lines. The I/O wires pass the amplified voltage signals to the data-output circuitry 52 and eventually out to the data bus 32.

The data-output circuitry 52 may include a data driver (not shown) to drive data out onto the data bus 32 in response a read request directed to the memory array 38. Further, the data-output circuitry 52 may be coupled to an output buffer 54 to latch the read data until it is driven on the data bus 32 by the data driver. The timing source for the output buffer 54 may be provided by a delay lock loop (DLL) 56 which provides a shifted internal clock signal (CLKOUT) which is synchronous with the external system clock (XCLK), thus locking the output data signal (DATAOUT) on the data bus 32 to the system clock.

Figure 3:
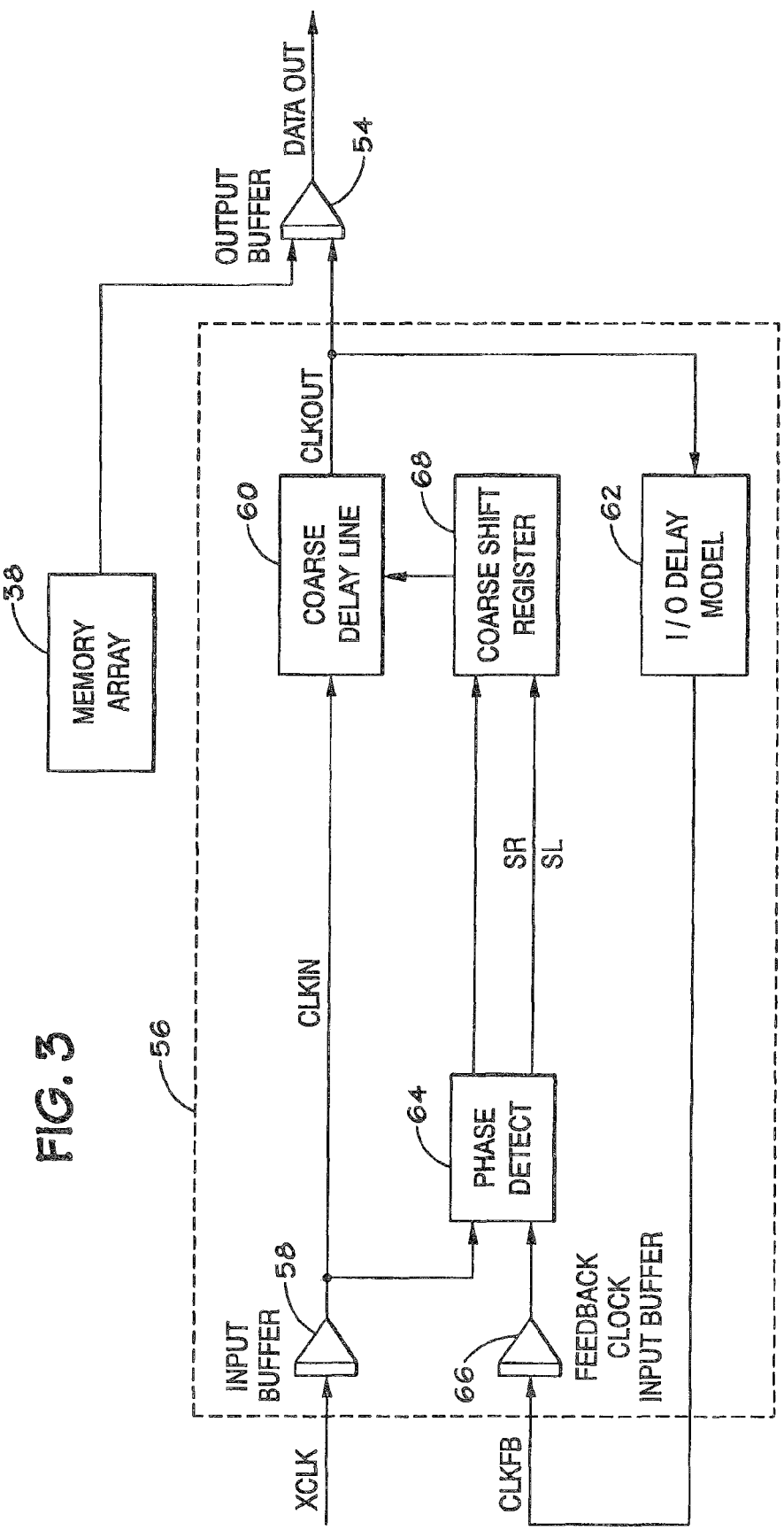
FIG. 3 illustrates a block diagram of a typical delay lock loop used to synchronize the output data from the memory device of FIG. 2 with the system clock.

Turning now to FIG. 3, an exemplary embodiment of a typical DLL 56 is illustrated. Differences in alignment between signals having the same frequency may arise due to propagation delays inherent in each of the various components in the system through which the signal of interest passes, as well as propagation delays caused by varying lengths of signal buses in the system. For example, it may be desirable to drive various components in the system with a reference clock signal generated by an external source and to obtain an output signal from the driven components which is synchronous with the reference clock signal. To reach the various components, the reference clock signal may be transmitted through various buffers and traverse buses of various lengths. Thus, when received at the input of a particular component, the clock signal may no longer be synchronous (i.e., is out of phase) with the reference clock signal.

A conventional DLL, such as the DLL 56, implements synchronization by forcing at least one of the edges of the clock signal for the data-output circuit 52 to align with a corresponding edge of the reference clock signal XCLK, thus locking the data output signal (DATAOUT) to the reference clock signal XCLK. The DLL 56 detects a phase difference between two signals and generates a corresponding feedback signal representative of the difference which is used to introduce or remove delay elements as needed to attain alignment of the data output signal DATAOUT with the reference clock signal (XCLK).

In the DLL 56 illustrated in FIG. 3, a reference clock signal XCLK is received by an input buffer 58 and provided to a delay line 60 as a buffered clock signal CLKIN. The delay line may be referred to as a "coarse" delay line, as discussed further below. The delay line 60 includes a number of individual delay units. As can be appreciated, each individual delay unit may comprise logical gates such as inverters, NAND gates or AND gates. Each individual delay unit provides an increment of delay time when the delay unit is enabled and the internal clock signal (CLKIN) propagates through it.

The output of the delay line 60 is connected to an output buffer 54 and an input/output (I/O) delay model circuit 62. The I/O delay model circuit 62 provides a feedback clock signal (CLKFB) which is transmitted to a phase detector 64 for comparison with the buffered reference clock signal CLKIN. The I/O delay model circuit 62 introduces delays in the feedback path corresponding to the delay produced in the input buffer 58 and the output buffer 54. The I/O delay model circuit 62 thus provides a signal path for the external clock signal XCLK. The feedback clock signal CLKFB may be transmitted to the phase detector 64 through a feedback clock input buffer 66.

The phase detector 64 determines whether a difference exists between the phase of the feedback clock signal CLKFB and the buffered reference clock signal CLKIN and generates the signals for controlling the shift register 68 to shift right or shift left to increase or decrease the delay through the delay line 60. The detected difference determines the amount of delay to be introduced in or removed from the delay line 60 by a shift register 68 such that the buffered reference clock signal CLKIN may be shifted by an appropriate amount to produce an output clock signal CLKOUT that aligns, or locks, with the reference clock signal XCLK. The phase detector 64 generates control signals in response to a detected phase difference between the internal clock signal CLKIN and the feedback clock signal CLKFB. Each individual control cell or flip-flop has an output that is coupled to a corresponding individual delay unit within the delay line 60. Each individual delay unit represents an increment of delay time that can be provided by the delay line depending on the control signal coupled from its corresponding flip-flop. The output of the individual flip-flop determines whether the input clock signal CLKIN will propagate through the individual delay unit and hence whether the individual delay unit adds to the total delay of the output clock signal CLKOUT.

The delay line 60 is adjustably controlled with digital data stored in the shift register 68. The delay line 60 delays the internal clock signal CLKIN by the amount programmed into the shift register 68. The internal clock out (CLKOUT) signal may be implemented to clock the output buffer 54 such that data from the memory array 38 is clocked through the output buffer 54 on the subsequent rising and falling edges of the external clock signal XCLK. As can be appreciated, the data from the memory array 38 is delivered to the output buffer 54 through a number of devices, such as the sense amplifiers 48 and data output circuitry 52, as illustrated in FIG. 2. For simplicity, these elements have been omitted from FIG. 3.

When the DLL 56 has locked the data output signal CLKOUT to the reference clock signal XCLK, no difference should exist between the phases of the buffered clock signal CLKIN and the clock feedback signal CLKFB. Thus, a DLL 56 is locked when the total delay in the forward path is equal to the total delay in the feedback path. Expressed another way:

$$d_{forward} = t_{input\ buffer} + t_{delay\ line} + t_{output\ buffer}$$

$$d_{feedback} = t_{delay\ line} + t_{model}$$

$$d_{forward} = d_{feedback}$$

where dforward corresponds to the delay between the reference clock signal and the data output signal; dfeedback corresponds to the delay in the I/O delay model circuit; tinputbuffer corresponds to the delay of the input buffer 58;

tdelay line corresponds to the delay in the delay line 60; toutput buffer corresponds to the delay of the output buffer 54; and tmodel corresponds to the delay in the I/O delay model circuit 62. Thus, to achieve phase lock, $$t_{model} = t_{input\ buffer} + t_{output\ buffer}$$

Thus, the I/O delay model circuit 62 introduces delays in the feedback path corresponding to the delay ($t_{input\ buffer}$) introduced by the input buffer 58 and the delay ($t_{output\ buffer}$) introduced by the output buffer 54. Because $t_{model}$ is a constant, when the input changes frequency, the $t_{delay}$ line should change in response to the changing input. The phase detector 64 will output a shift left or shift right depending on whether the buffered clock signal CLKIN is too fast or too slow. The shift register 68 then shifts the tap point of the delay line 60 by one delay element. The process is repeated until the input signals to the phase detector 64 have equal phase and the DLL 56 is locked.

Figure 4:
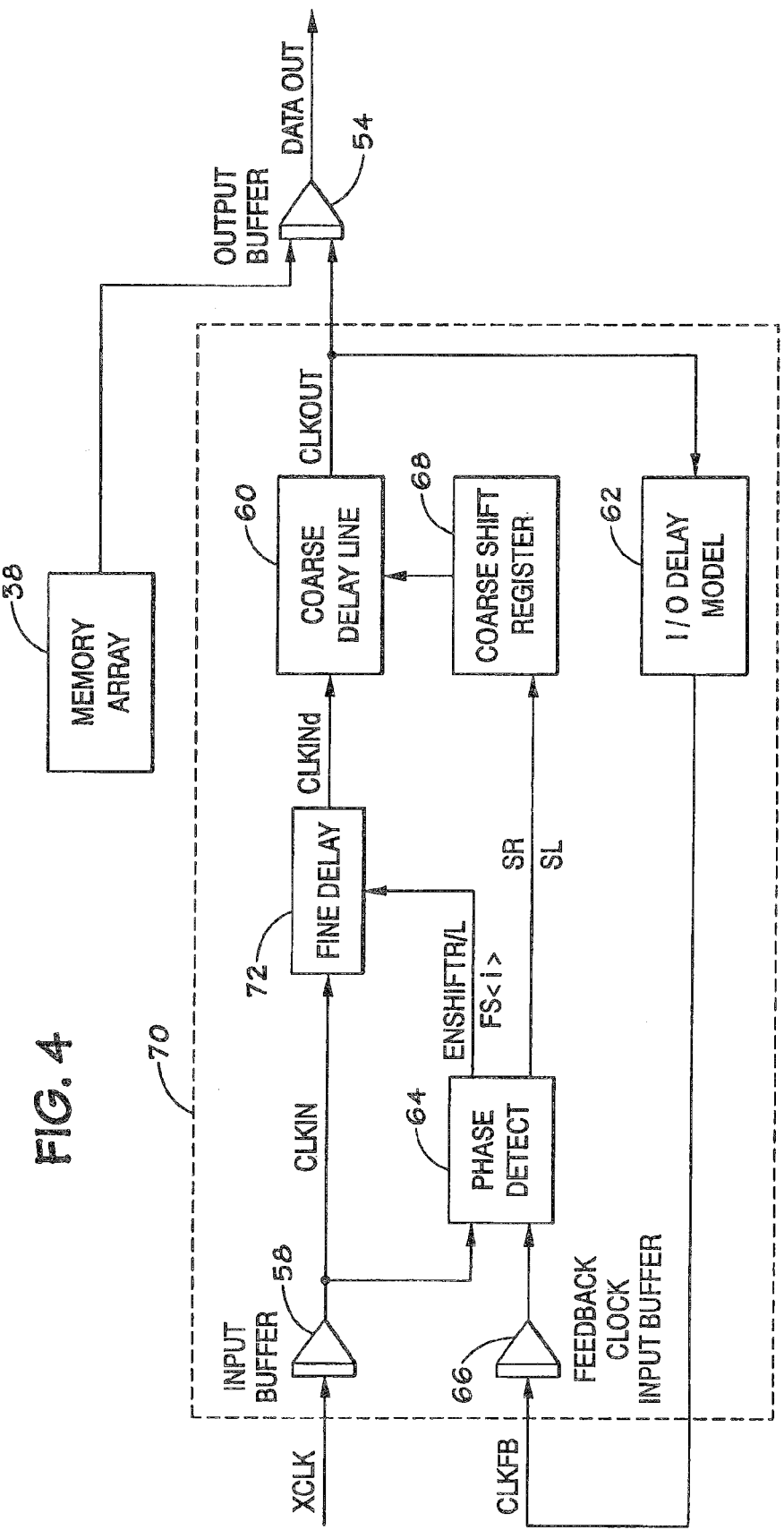
FIG. 4 illustrates a block diagram of a fast lock delay lock loop in accordance with the present technique.

For high speed operation, multiple tuning elements may be implemented. Turning now to FIG. 4, an exemplary DLL circuit which may be configured in accordance with the present techniques is illustrated. The DLL circuit 70 is nearly identical to the DLL circuit 56, illustrated in FIG. 3. Accordingly, like reference numerals have been used to depict like features. However, the DLL 70 includes a fine delay block 72. The fine delay block 72 allows for finer resolution tuning of the DLL 70. The fine delay block 72 is described further below. During initialization, the coarse shift register 68 is implemented to adjust the entry point of the coarse delay line 60. Once the phase difference between the input clock signal CLKIN and the feedback clock CLKFB is relatively small, the fine delay block 72 may be implemented to minimize the phase difference even further.

Figure 5:
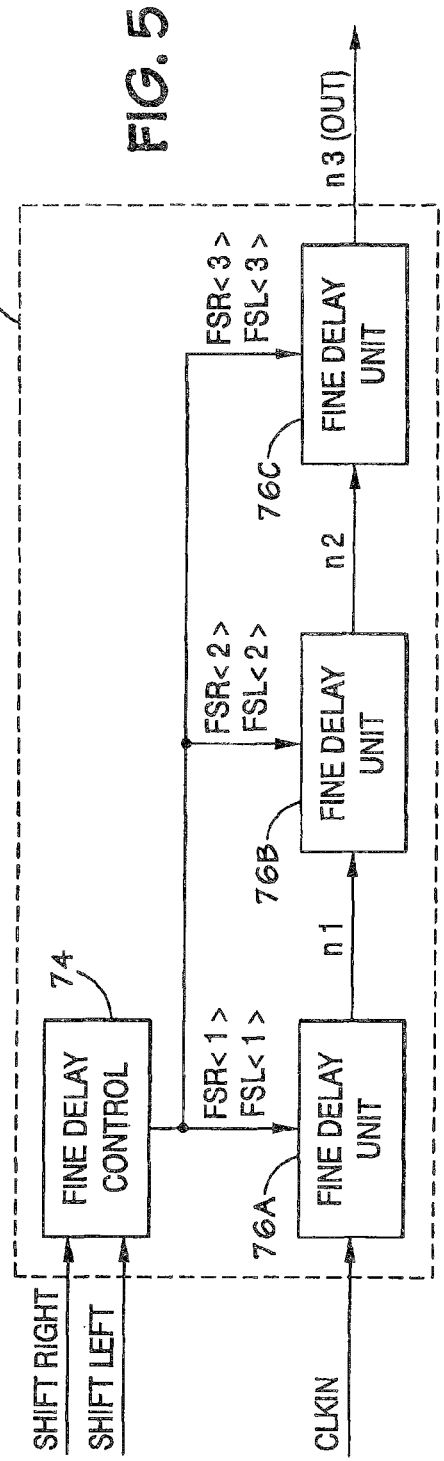
FIG. 5 illustrates a block diagram of a conventional fine delay block.

Referring now to FIG. 5, a conventional fine delay block 72 is illustrated. The fine delay block 72 includes a fine delay control 74 and fine delay units 76A-C. As can be appreciated, the fine delay units 76A-C may be individual units of a delay line, for instance. As previously described, a delay line generally includes individual elements such as inverters which may be implemented to add delay to an input signal (here CLKIN). The fine delay control 74 receives the shift right or shift left instruction from the phase detector 64 (FIG. 4). The fine delay control 74 sends the fine shift left or fine shift right (FSR/FSL) instructions to the fine delay units 76A-C to implement the appropriate time delay. The block diagram of FIG. 5 may be better understood with reference to the timing diagrams illustrated in FIGS. 6 and 7, discussed below.

Figure 6:
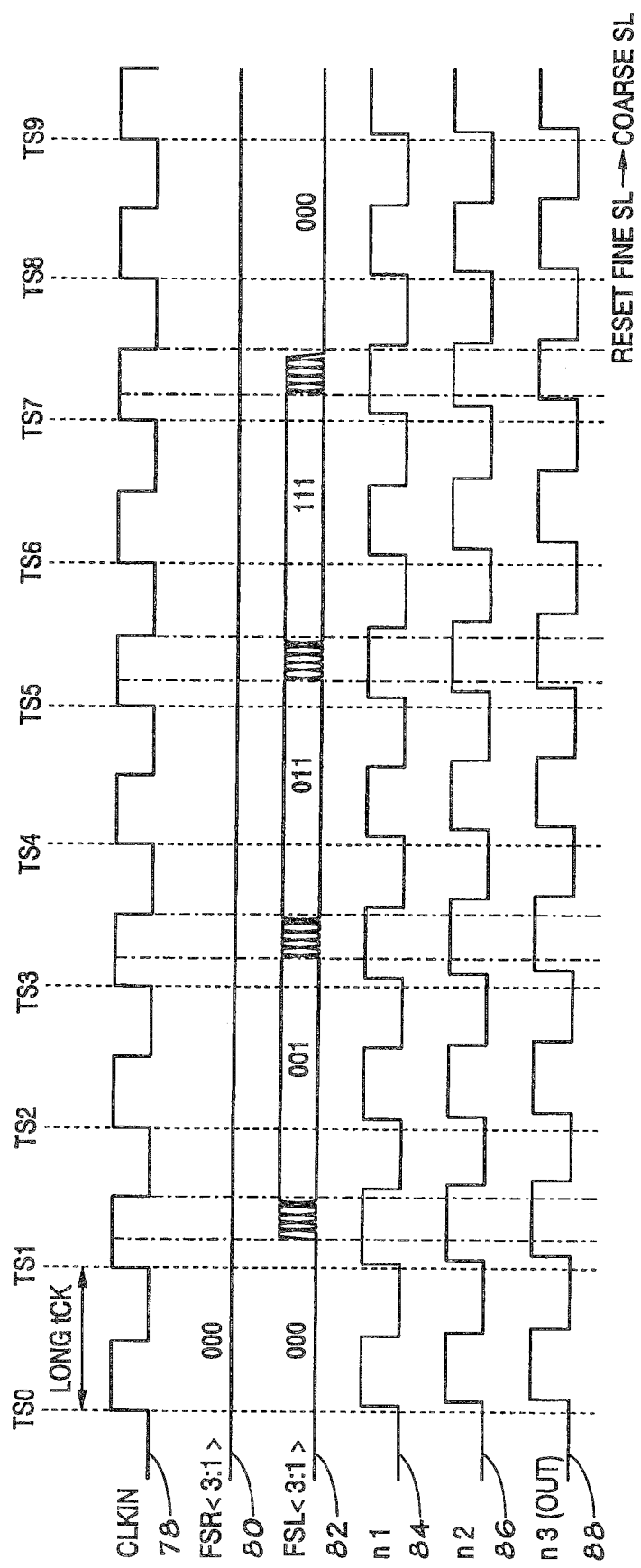
FIG. 6 is a timing diagram corresponding to the fine delay block of FIG. 5 and associated with low speed processing.

FIG. 6 illustrates a timing diagram that may be associated with low speed processing. That is to say, the period of the buffered clock signal CLKIN (tCK) is generally greater than 5 ns. As previously described, the fine delay feature of the DLL 70 provides a more finite delay than the coarse delay feature. Accordingly the fine delay may be defined in terms of the coarse delay. For illustrative purposes, each coarse delay element or unit corresponds to four fine delay elements or units. That is to say, in the example described below, 1c=4f. As used herein, "FSL <3:1>" indicates that after three fine delay shifts to the left, a delay corresponding to a coarse delay is incurred, based on the relationship of the presently illustrated coarse delay and fine delay elements. As will be appreciated, the relationship between the coarse delay units and the fine delay units may vary depending on the system.

In the present exemplary embodiment, the input signal, here the buffered clock signal CLKIN, is delayed to provide the appropriate locking of the DLL 70. In the present exemplary embodiment, the fine delay control 74 receives an instruction from the phase detector 64 to shift the buffered clock signal CLKIN to the left. The active fine shift left (FSL) signal is enabled every two clock cycles. In the present example, the fine shift right (FSR) signal is not enabled. However, it should be understood that the present exemplary discussion applies to a fine shift right (FSR) instruction as well.

To ensure proper operation, the FSL signal should transition while the input signal (the buffered clock signal CLKIN) is high. Further, to ensure proper operation, the FSL signal should transition while the shifted clock signals n1, n2 and n3 are also high. As can be appreciated, with the presently illustrated low speed operation, the timing of the FSL signal is acceptable. That is to say that the FSL signal transitions properly while each of the input signals n1, n2 and n3 are high as illustrated in FIG. 6. In the present example, the closest timing margin comes in the transition from 111 to 000 (i.e., between TS7 and TS8). However, because the FSL signal is enabled while the buffered clock signal CLKIN and the fine shift signals n1, n2 and n3 are high, the timing margin in the exemplary DLL 70 is sufficient for low speed applications. However, with regard to high speed applications, as illustrated with respect to FIG. 7 and described further below, the timing margin may be insufficient to allow for proper operation of the DLL 70.

Figure 7:
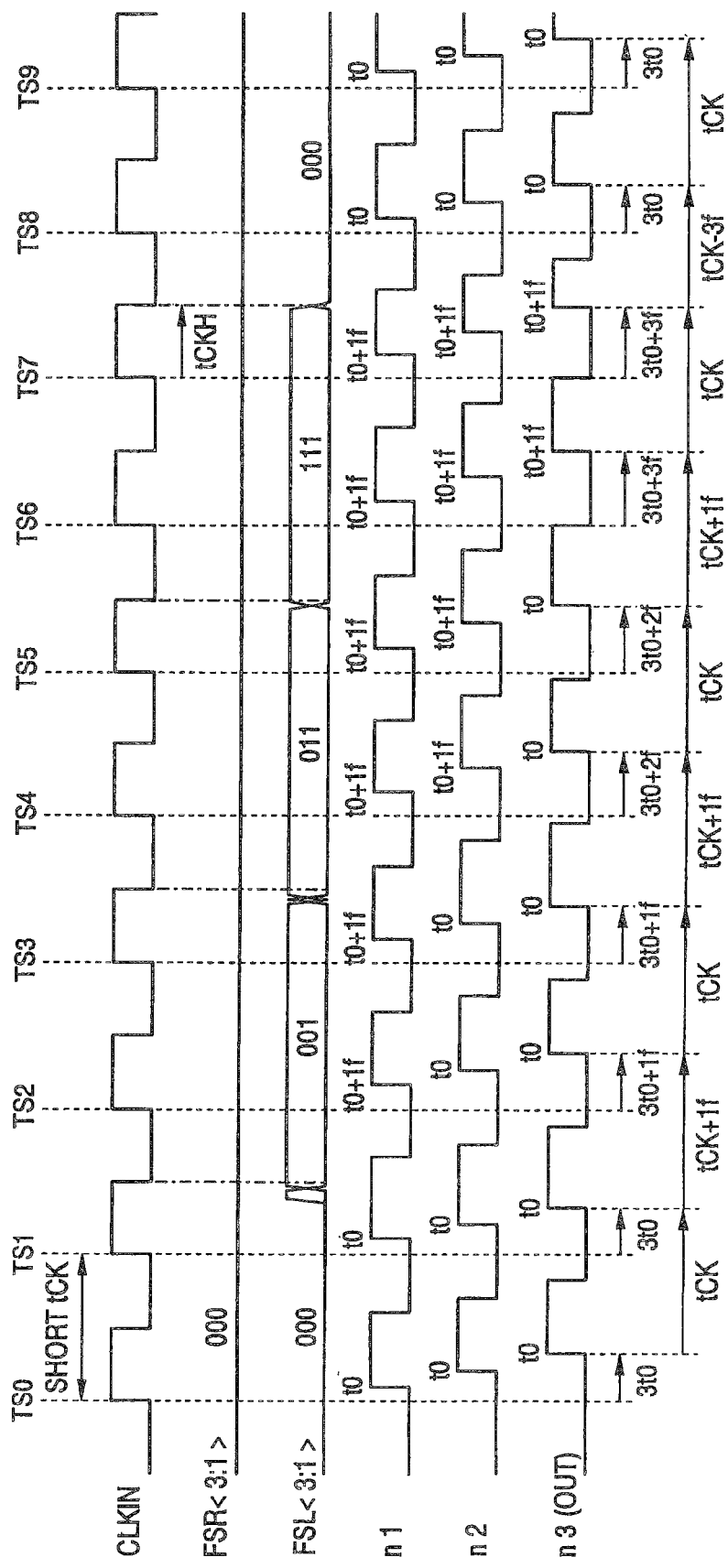
FIG. 7 is a timing diagram corresponding to the fine delay block of FIG. 5 and associated with high speed processing.

FIG. 7 illustrates a timing diagram that may be associated with high speed processing. That is to say, the period of the buffered clock signal CLKIN (tCK) is generally less than 4 ns. Continuing with the above-referenced example, for illustrative purposes, each coarse delay element or unit corresponds to four fine delay elements or units (1c=4f). As illustrated in FIG. 7, the timing of the fine shift may become problematic in high speed application. For example, at time TS7, if 3t0+3f is greater than or equal to the time tCKH in which the buffered clock signal CLKIN is high, the transition of the FSL signal (in this example) may effect n1, n2 or n3. Disadvantageously, this minimal timing margin may cause jitter in high speed applications.

Figure 8:
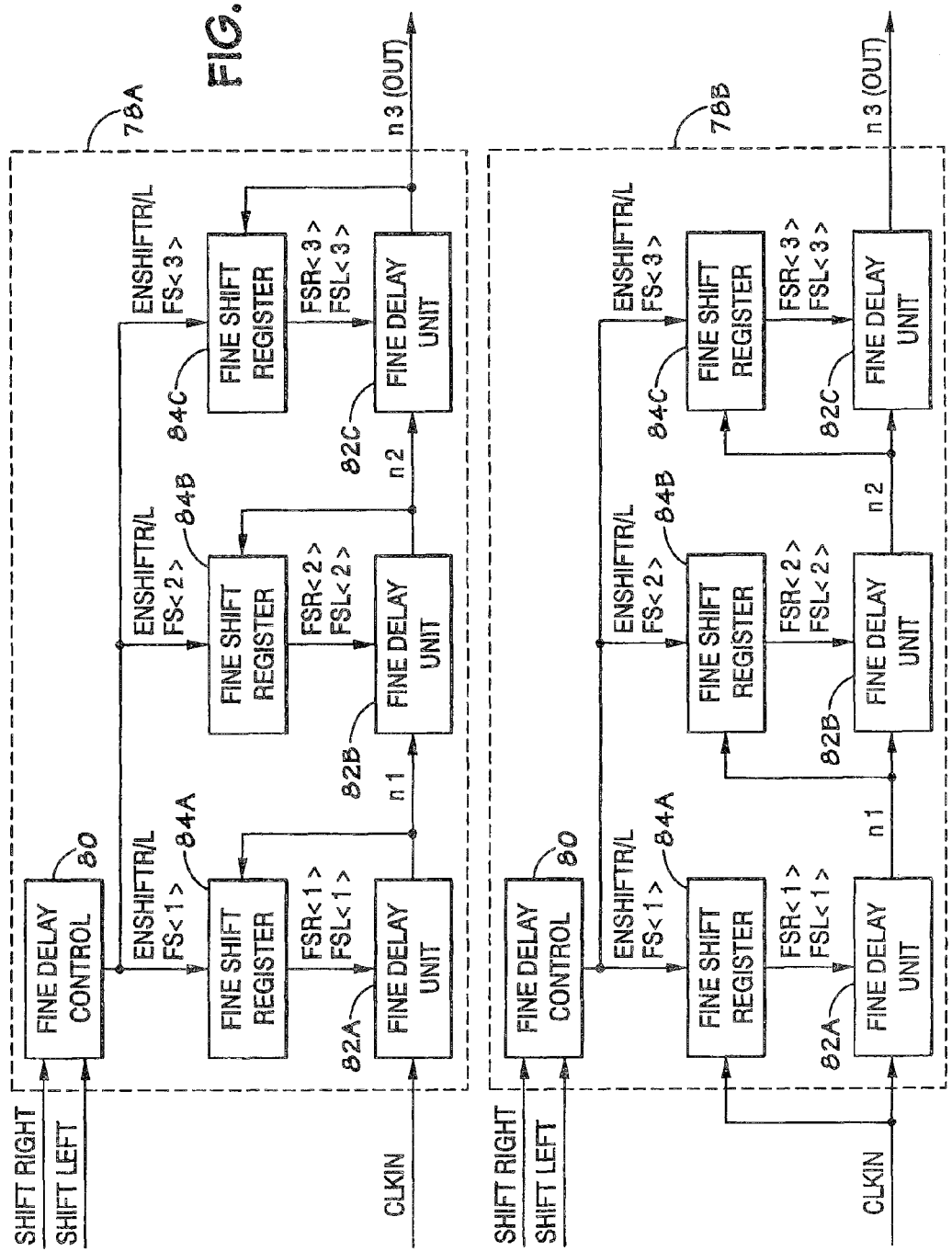
FIG. 8 illustrates a block diagram of a fine delay block in accordance with embodiments of the present techniques.
Figure 9:
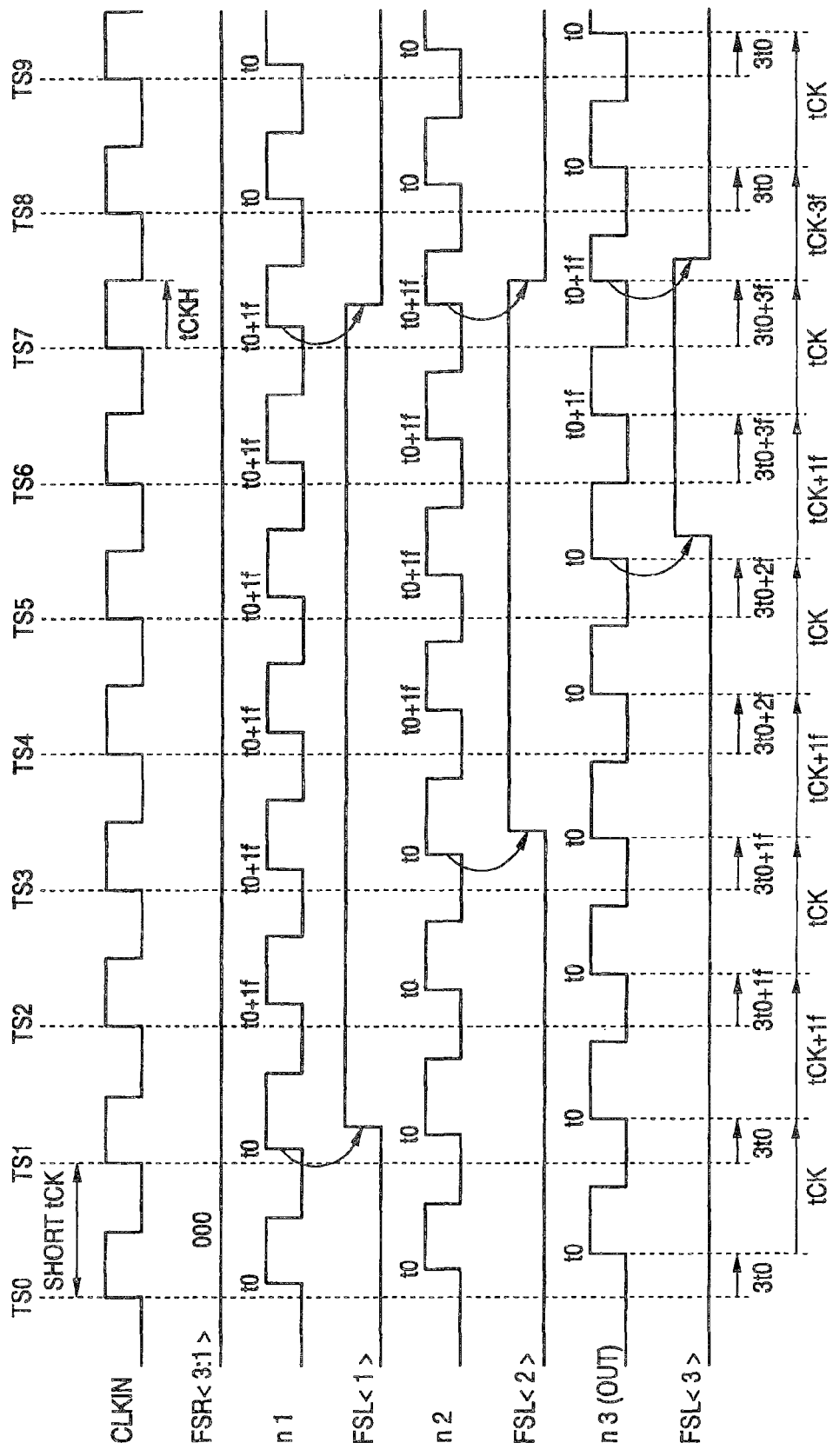
FIG. 9 is a timing diagram corresponding to the fine delay block of FIG. 8.

FIGS. 8 and 9 illustrate an improved fine delay unit 78 which may be implemented in place of the fine delay unit 72 illustrated in the DLL 70 of FIG. 4 such that the control for the DLL fine shift and DCC for the DLL 70 is improved. In accordance with the present exemplary embodiment, FSL <3:1> is enabled/disabled by the output of the fine delay unit, and therefore there is no jitter induced by the timing of the fine delay unit 78. As will be appreciated, while the exemplary fine delay unit 78 is implemented in the current exemplary embodiment for controlling the fine shift of the DLL 70, the embodiments described herein may be implemented for use in any kind of programmable timing logic.

Referring now to FIG. 8, block diagrams of two exemplary fine delay units 78A and 78B in accordance with embodiments of the present invention are illustrated. As will be appreciated, the selection of the fine delay unit 78A or 78B in a particular application is dependent on the clock speed and the speed of the fine shift register implemented in the fine delay unit 78. If the clock speed is slow and the speed of the fine shift register is fast, the fine delay unit 78A may be implemented. If the clock speed is fast and the speed of the fine shift register is slow, the fine delay unit 78B may be implemented. As indicated in FIG. 8, the only difference between the fine delay unit 78A and the fine delay unit 78B is the point at which the fine delay unit output signal is fed back to the fine shift register element for each of the fine delay units. Accordingly, each of the element blocks in the fine delay units 78A and 78B are identical. Accordingly, for illustrative purposes, like reference numerals have been used to designate the blocks implemented in each of the fine delay unit 78A and 78B.

The fine delay units 78A and 78B include a fine delay control 80, fine delay units 82A-C and fine shift registers 84A-C. As can be appreciated, the fine delay control 80 receives the shift right or shift left instruction from the phase detector 64 (FIG. 4). The fine delay control 80 implements a single enable (ENSHIFTR/L) to enable the fine shift register 84A-84C. The fine shift register 84A-84C enables one of a respective fine delay units 82A-82C. As illustrated in the timing diagram of FIG. 9, the present exemplary embodiment of the fine delay units 78A and 78B is advantageous in eliminating jitter induced by high speed applications.

Figure 10A:
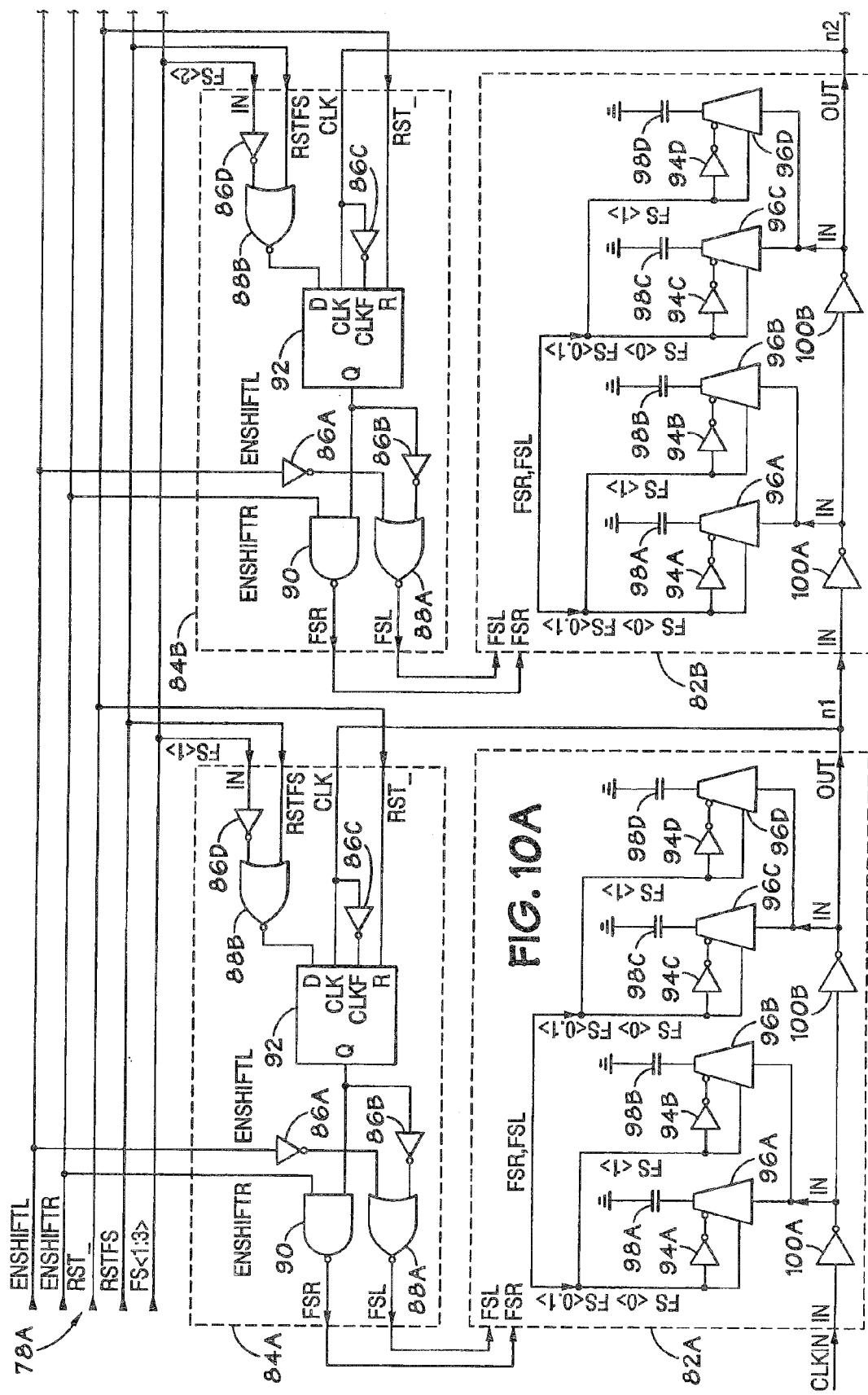
FIGS. 10A and 10B illustrate a schematic diagram of an exemplary system in accordance with an embodiment of the present technique corresponding to the block diagram of FIG. 8.
Figure 10B:
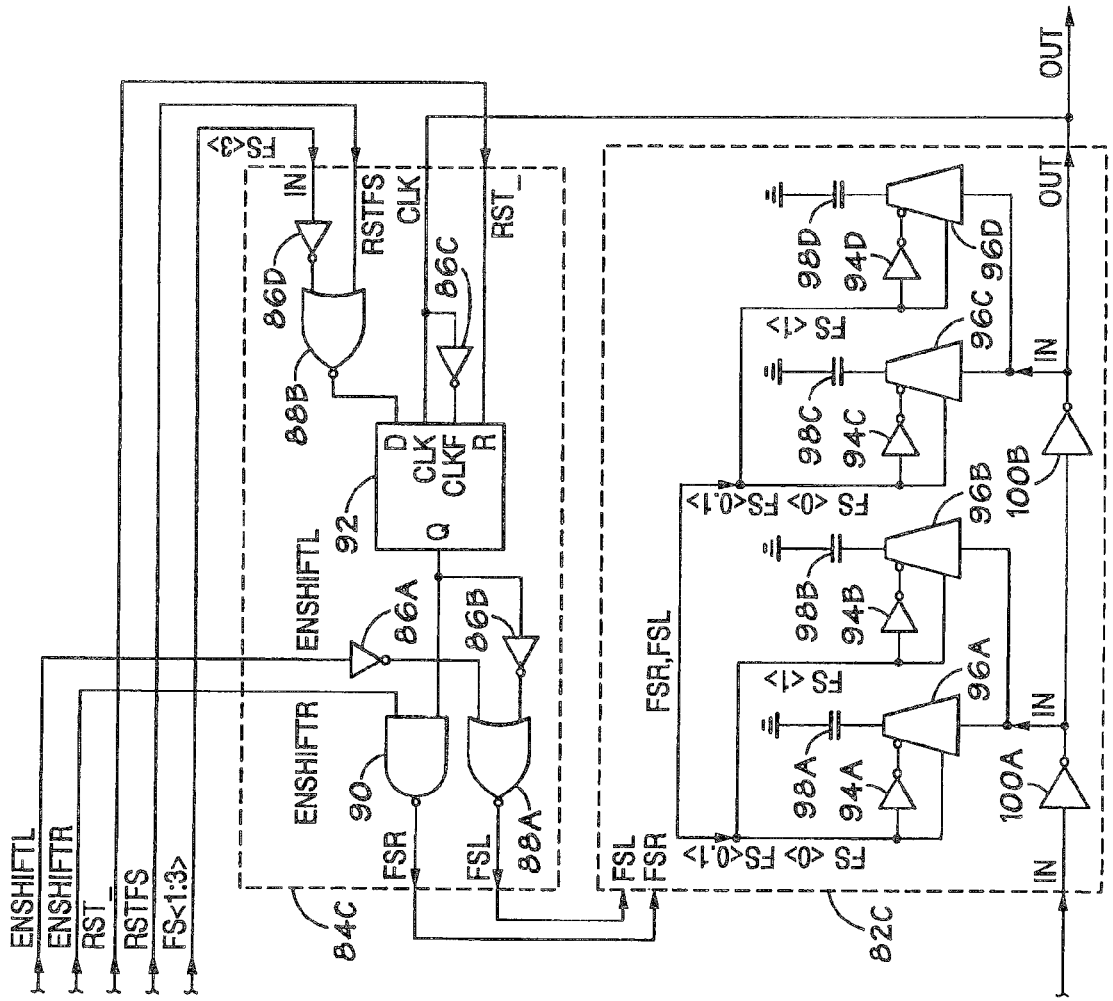

FIGS. 10A and 10B illustrate a schematic diagram of an exemplary embodiment corresponding to the block diagram of the improved fine delay unit 78A of FIG. 8. As previously described, the same design may be used for fine delay unit 78B, as well. As will be appreciated by those skilled in the art, a number of specific arrangements of components can be implemented in accordance with the present techniques. The exemplary embodiment of FIG. 10 is simply provided by way of example.

In the present exemplary embodiment, each fine shift register 84A-84C includes a number of inverters 86A-86D, NOR gates 88A-88B, a NAND gate 90 and a flip-flop 92. The components of the fine shift register 84A-84C are arranged to enable the shifting of a respective fine delay unit 82A-82C. Each fine delay unit 82A-82C includes a number of inverters 94A-94D, multiplexors 96A-96D and capacitors 98A-98D arranged to shift the input signal CLKIN in accordance with the instructions from the fine shift register 84A-84C. As will be appreciated, the CLKIN signal path also includes a number of inverters 100A-100B in each fine delay unit 82A-82C having desired delay.

Figure 11:
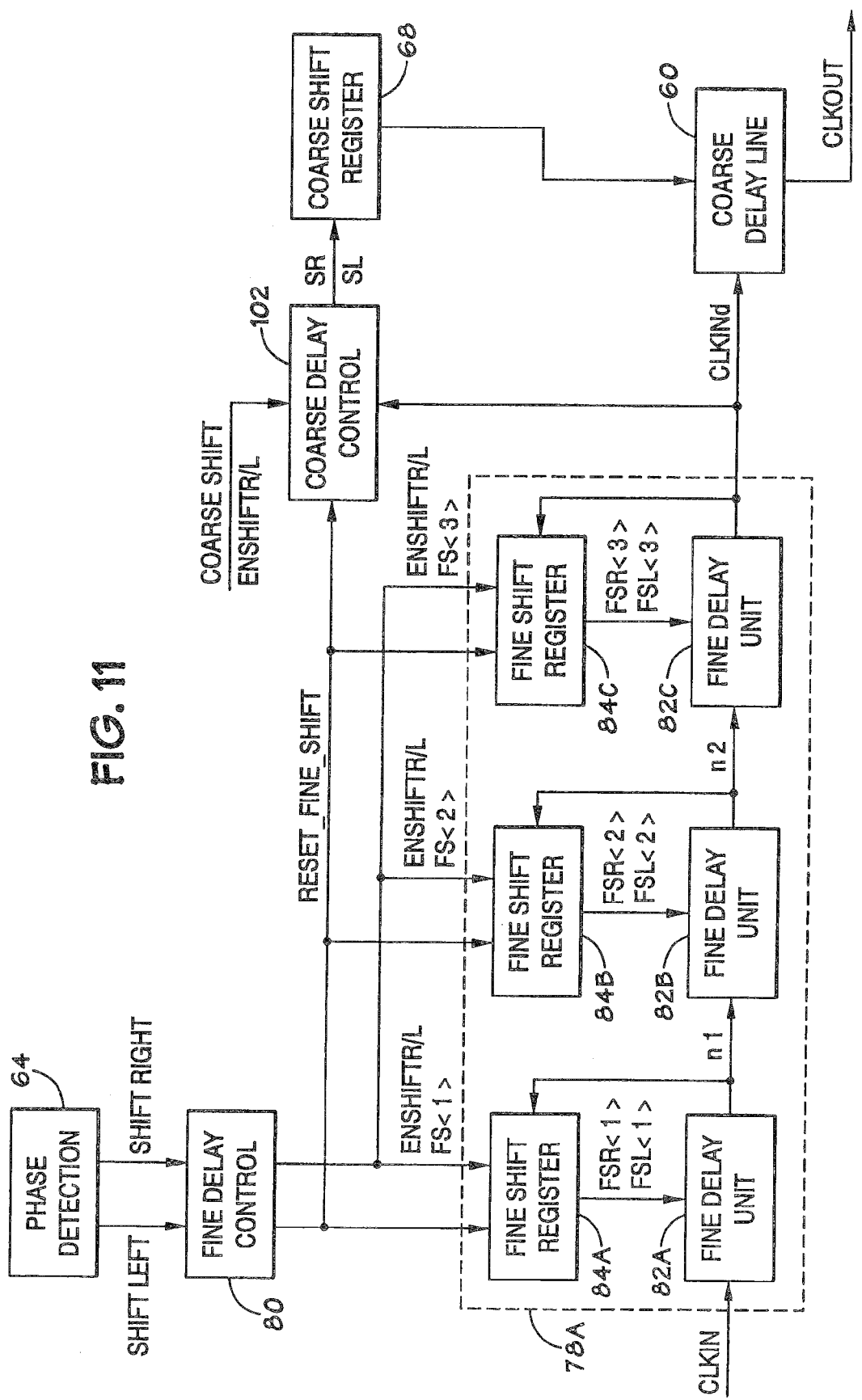
FIG. 11 is a block diagram of a delay lock loop fabricated in accordance with embodiments of the present techniques.

Referring now to FIG. 11, an exemplary embodiment illustrating the improved fine delay unit 78A of FIG. 8 is implemented to control the coarse delay of the DLL 70 (FIG. 5) during fine tuning mode. This implementation of using the fine delay to control the coarse delay is also advantageous in high speed applications (small tCK) because the timing control may be stringent. In the present exemplary embodiment, the internal clock signal CLKINd from the fine delay unit 78A is used to generate the SR/SL timing for the coarse delay control 102. The coarse delay control 102 and thus, the SR/SL signal, is controlled by Reset_Fine_Shift, EnShiftR/L and CLKINd during the fine tuning mode. Therefore, the fine delay control is correlative to the coarse shift register.

To illustrate the implementation of the fine delay block 78 to control the coarse delay, if the DLL needs a series of six fine shifts left to lock the signals, and the relationship between the coarse delay and the fine delay is 1c=4f, the following series of shifts are provided:

| | | | |
|---|---|---|---|
| 0f -> 1f left(1fL) -> 1f left(2fL) -> 1f left(3fL) -> reset fine(0f) and 1c left -> 1f left(1fL) -> 1f left(2 fL) | | | |
| FSL<3:1>000 | 001 | 011 | 111 |
| 000 | | 001 | 011 |

As will be appreciated, after three fine shifts left, the fine shift left is reset and one coarse shift left is implemented. Because the fine tuning control is self-tuned, the timing margin of the fine delay unit 78 will not disadvantageously affect the timing margin of the coarse delay.

Figure 12A:
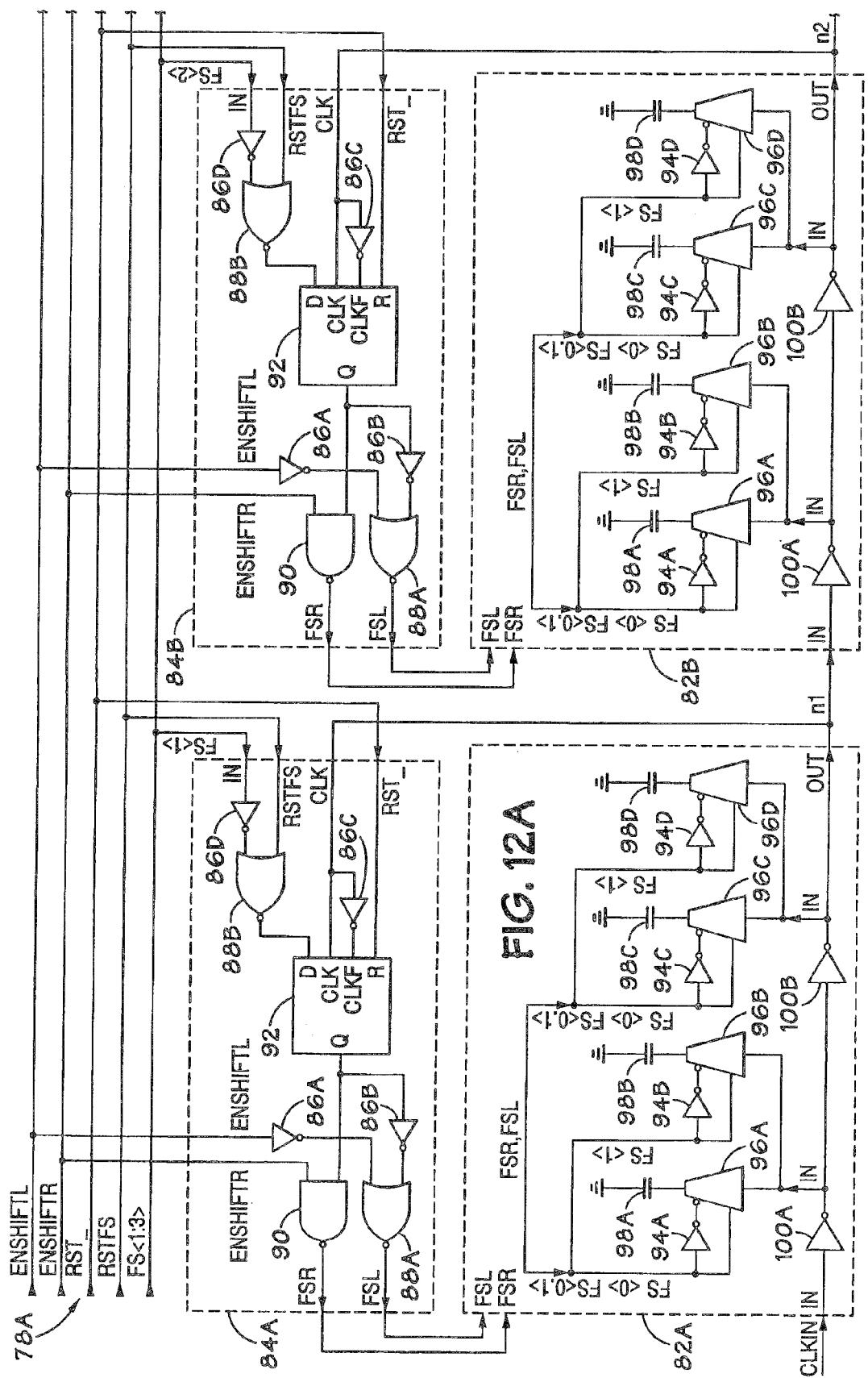
FIGS. 12A and 12B illustrate a schematic diagram of an exemplary system in accordance with an embodiment of the present technique corresponding to the block diagram of FIG. 11.
Figure 12B:
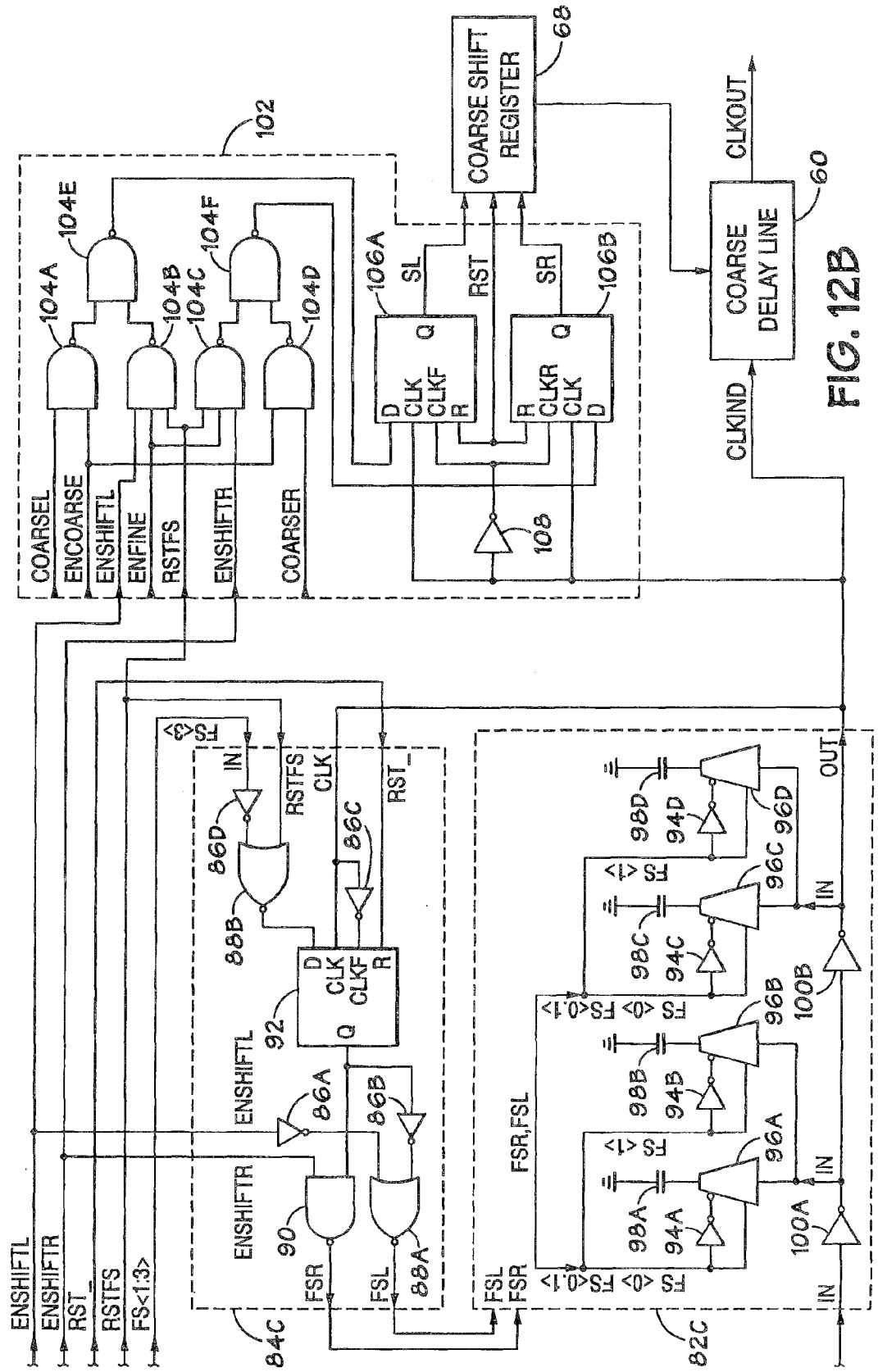

FIGS. 12A and 12B illustrate a schematic diagram of an exemplary embodiment corresponding to the block diagram of the improved fine delay unit 78A of FIG. 11. As previously described, the same design may be used for fine delay unit 78B, as well. As will be appreciated by those skilled in the art, a number of specific arrangements of components can be implemented in accordance with the present techniques. The exemplary embodiment of FIG. 12 is simply provided by way of example.

Each of the components in the fine delay unit 78A of FIG. 12 have been previously described with reference to FIGS. 10A and 10B. Like reference numerals are used to describe like components. In addition, an exemplary embodiment of the coarse delay control 86 is illustrated in FIGS. 12A and 12B. In the present exemplary embodiment, the coarse delay control 102 includes a number of NAND gates 104A-104F, flip flops 106A-106B and an inverter 108 arranged to control the coarse shifting along the input signal path CLKIN. As previously described, the coarse delay control 102 is controlled by control signals Reset_Fine_Shift, EnShiftR/L and CLKINd. As will be appreciated, alternate embodiments of the coarse delay control 102 are also envisioned.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A delay lock loop comprising:
   a fine delay block comprising:
      a plurality of fine shift registers configured to receive a first enable signal from a fine delay control and configured to produce a second enable signal; and
      a plurality of fine delay units configured to receive the second enable signal and produce a fine delay unit output comprising a shifted input signal, wherein each of the plurality of fine delay units is configured to shift a signal by a first time delay; and
   a coarse delay block comprising:
      a coarse delay shift register configured to be controlled by the fine delay block and produce a third enable signal; and
      a plurality of coarse delay units configured to receive the third enable signal and wherein each of the plurality of coarse delay units is configured to shift a signal by a second time delay, wherein the second time delay is greater than the first time delay, wherein the coarse delay block comprises an inverter, the inverter having a single input and being configured to control shifting a signal in the coarse delay block,
   wherein in the event that the fine delay block shifts the input signal by the second time delay, the fine delay block is reset.

2. The delay lock loop, as set forth in claim 1, wherein the coarse delay block is configured to receive a shifted signal from the fine delay block.

3. The delay lock loop, as set forth in claim 1, wherein the coarse delay block is configured to receive an internal clock signal from the fine delay block.

* * * * *